United States Patent
Akiyama et al.

[11] Patent Number: 6,066,531
[45] Date of Patent: May 23, 2000

[54] METHOD FOR MANUFACTURING SEMICONDUCTOR MEMORY DEVICE

[75] Inventors: Yukiharu Akiyama; Takuji Tanigami; Shinichi Sato, all of Fukuyama, Japan

[73] Assignee: Sharp Kabushiki Kaisha, Osaka, Japan

[21] Appl. No.: 09/099,520

[22] Filed: Jun. 18, 1998

[30] Foreign Application Priority Data

Jun. 26, 1997 [JP] Japan ................................. 9-169881

[51] Int. Cl.$^7$ ................................................. H01L 21/336
[52] U.S. Cl. ......................... 438/257; 438/262; 438/286; 438/302; 438/303; 438/593
[58] Field of Search ..................... 438/257, 262, 438/263, 264, 286, 299, 301, 302, 303, 305, 306, 307, 201, 593, 594

[56] References Cited

U.S. PATENT DOCUMENTS

| | | | |
|---|---|---|---|
| 5,210,044 | 5/1993 | Yoshikawa | 438/257 |
| 5,292,675 | 3/1994 | Codama | 438/163 |
| 5,436,205 | 7/1995 | Hirose | 438/572 |
| 5,482,879 | 1/1996 | Hong | 438/264 |
| 5,648,668 | 7/1997 | Kasai | 257/280 |
| 5,759,896 | 6/1998 | Hsu | 438/264 |

FOREIGN PATENT DOCUMENTS

| | | |
|---|---|---|
| 4-137558 | 5/1992 | Japan . |
| 9-102554 | 4/1997 | Japan . |

*Primary Examiner*—Carl Whitehead, Jr.
*Assistant Examiner*—Khanh Duong
*Attorney, Agent, or Firm*—Nixon & Vanderhye, P.C.

[57] ABSTRACT

A method for manufacturing a semiconductor memory device, including the steps of: forming a plurality of stripes comprising a first floating gate material film and a ion implantation protective film, covering one longitudinal side wall of the stripes with a resist pattern; removing a given width of the other side wall of the first floating gate material film by an isotropic etching in use of the resist pattern as a mask; forming an impurity region of low concentration by implanting impurity ions of a second conductivity type into the semiconductor substrate of the first conductivity type in use of the ion implantation protective film as a mask in a tilted direction after removing the resist pattern; and forming asymmetrical impurity regions on both sides of the stripe like first floating gate material film as viewed in the cross section along the direction perpendicular to the longitudinal direction of the stripes. According to the above-mentioned method, without using a side wall spacer, a semiconductor memory device provided with asymmetrical impurity regions having precisely desired forms can be obtained.

10 Claims, 14 Drawing Sheets

_US 6,066,531_

METHOD FOR MANUFACTURING SEMICONDUCTOR MEMORY DEVICE

CROSS-REFERENCE TO RELATED APPLICATIONS

This application is related to Japanese patent application No.HEI9(1997)-169881, filed on Jun. 26, 1997 whose priority is claimed under 35 USC § 119, the disclosure of which is incorporated by reference in its entirety.

BACKGROUND OF THE INVENTION

1. Field of the Invention

The present invention relates to a method for manufacturing a semiconductor memory device. More particularly, the present invention relates to a method for manufacturing a semiconductor memory device having a floating gate, a control gate and asymmetrical source/drain regions.

2. Related Arts

A typical method for manufacturing a flash memory which is a conventional asymmetrical non-volatile semiconductor memory device will be hereinafter explained with reference to FIGS. 14 and 8(a) to 13(c). FIG. 14 is a top view of a flash memory which is an asymmetrical non-volatile semiconductor memory device. FIGS. 8(a) to 10(c) each represent a view showing a cross section along the line X—X for explaining a method for manufacturing the conventional asymmetrical semiconductor memory device of FIG. 14. FIGS. 11(a) to 13(c) each represent a view showing a cross section along the line Y—Y for explaining the method for manufacturing the conventional asymmetrical semiconductor memory device of FIG. 14.

First, a gate oxide film 22 is formed to a thickness of about 100 Å on a surface of a p-type silicon substrate 21, and then a polysilicon layer 23 for a floating gate is formed to a thickness of 2000 Å. Further, an implantation of phosphorus ions ($^{31}P^+$) is carried out into the polysilicon layer 23 with an implantation energy of 40 keV in a dose of $2.0\times10^{15}$ cm$^{-2}$. Subsequently, a thin nitride film 24 is deposited to a thickness of 600 Å on the polysilicon layer 23 (FIGS. 8(a) and 11(a)).

Then, a resist pattern 25 is formed on the thin nitride film 24 so as to cover the entire surface of an active region in the silicon substrate 21. In use of the resist pattern 25 as a mask, the nitride film 24, the polysilicon layer 23 and the gate oxide film 22 are successively etched (FIGS. 8(b) and 11(b)).

Subsequently, the resist pattern 25 is removed and an implantation of arsenic ions ($^{75}As^+$) is carried out into the entire surface of the silicon substrate 21 with an implantation energy of 40 keV in a dose of $5.0\times10^{13}$ cm$^{-2}$ to form an n-type impurity region 26 of low concentration in the silicon substrate 21 (FIGS. 8(c) and 11(c)).

Then, a resist pattern 27 is formed so as to cover only a source-side region 26a of the n-type impurity region 26 of low concentration. In use of the resist pattern 27 and the nitride film 24 as a mask, an implantation of arsenic ions ($^{75}As^+$) is carried out into the entire surface of the silicon substrate 21 with an implantation energy of 40 keV in a dose of $3.0\times10^{15}$ cm$^{-2}$ to form an n-type impurity region 28 of high concentration in the silicon substrate 21 (FIGS. 8(d) and 11(d)).

Subsequently, the resist pattern 27 is removed and an HTO film 29 of $SiO_2$ (insulating film) is laminated to a thickness of 3000 Å on the entire surface of the silicon substrate 21 by means of CVD method (FIGS. 9(a) and 12(a)). Subsequently, by etching back the HTO film 29, a side wall spacer 30 is formed only on the side wall of the nitride film 24 and the floating gate 23. Further, in use of this side wall spacer 30 and the nitride film 24 as a mask, an implantation of arsenic ions ($^{75}As^+$) is carried out into the entire surface of the silicon substrate 21 with an implantation energy of 40 keV in a dose of $2.0\times10^{15}$ cm$^{-2}$ to form an n-type impurity region 31 of low concentration and an n-type impurity region 32 of high concentration in a self-aligned manner in the silicon substrate 21 (FIGS. 9(b) and 12(b)).

Next, an interlayer insulating film 33 (a thermal oxide film or an HTO film) is deposited on the entire surface of the silicon substrate 21 (FIGS. 9(c) and 12(c)) followed by flattening the surface of the silicon substrate 21 by CMP method and then, the nitride film 24 is removed by heated phosphoric acid (FIGS. 10(a) and 13(a)).

Subsequently, in order to increase a coupling ratio with the gate, a polysilicon layer 34 is deposited to a thickness of 1000Å on the entire surface of the silicon substrate 21. Further, an ion implantation of phosphorus ions ($^{31}P^+$) is carried out into the entire polysilicon layer 34 with an implantation energy of 60 keV in a dose of $6.0\times10^{14}$ cm$^{-2}$. Next, with a resist pattern (not shown) used as a mask, the polysilicon layer 34 is patterned (FIGS. 10(b) and 13(b)) and then, the resist pattern is removed. Afterwards, an ONO film [HTO film 150 Å/SiN film 250 Å/HTO film 100 Å] is formed over the entire surface of the silicon substrate 21 and then, a polysilicon layer 36 for a control gate is deposited to a thickness of 1000 Å thereon. Afterwards, an implantation of phosphorus ions ($^{31}P^+$) is carried out into the polysilicon layer 36 with an implantation energy of 60 keV in a dose of $3.0\times10^{15}$ cm$^{-2}$.

Further, a tungsten silicide layer 37 is deposited to a thickness of 1000 Å over the entire surface of the substrate 21 and then, with a resist mask (not shown) used as a mask, the tungsten silicide layer 37, the polysilicon layer 36, the ONO film 35, the polysilicon layers 34 and 23 and the gate oxide film 22 are successively etched (FIGS. 10(c) and 13(c)). By this etching, the polysilicon layers 34 and 36 and the tungsten silicide layer 37 are formed into a first floating gate, a second floating gate and a control gate, respectively.

Afterwards, an NSG film of a thickness of 1000 Å and a BPSG film of a thickness of 5000 Å are deposited by CVD method as an insulating film, followed by performing a melt processing at 900° C. for 10 minutes. Then, a contact hole is formed by photolithography process. Subsequently, an Al—Si—Cu film is deposited to a thickness of 5000 Å by a sputtering method. Next, a metal wiring is formed by photolithography process to complete a flash memory.

However, according to the above-mentioned conventional manufacturing method, it is difficult to control the width of the side wall spacer of the HTO film within a precision range of ±0.05 μm because the ion implantation is conducted after forming the side wall spacer of the HTO film. If the width of the side wall spacer is too narrow, a breakdown voltage drops because of a punch-through. On the contrary, if the width of the side wall spacer is too wide, a read-out current decreases and electrical characteristics of a memory cell will not be stable. Moreover, the method for manufacturing the asymmetrical cell is complicated and requires a lot of steps.

SUMMARY OF THE INVENTION

Thus, the present invention provides a method for manufacturing a semiconductor memory device, comprising the steps of:

forming a gate insulating film, a first floating gate material film and an ion implantation protective film in this order over the surface of a semiconductor substrate of a first conductivity type;

forming a first resist pattern on the ion implantation protective film;

forming a plurality of stripes comprising the first floating gate material film and the ion implantation protective film, the stripes being spaced apart from each other by a given distance, by etching in use of the first resist pattern as a mask;

forming a second resist pattern to cover one longitudinal side wall of the stripes after removing the first resist pattern;

removing a given width of the other side wall of the first floating gate material film by an isotropic etching with the second resist pattern used as a mask;

forming an impurity region of a low concentration by implanting impurity ions of a second conductivity type into the semiconductor substrate of the first conductivity type with the ion implantation protective film used as a mask in a tilted direction after removing the second resist pattern; and forming asymmetrical impurity regions on both sides of the stripe like first floating gate material film as viewed in the cross section along the direction perpendicular to the longitudinal direction of the stripes by implanting impurity ions of the second conductivity type into the semiconductor substrate of the first conductivity type with the ion implantation protective film used as a mask in the direction perpendicular to the semiconductor substrate to form an impurity region of high concentration.

According to the above-mentioned method, without using a side wall spacer, a semiconductor memory device provided with asymmetrical impurity regions having precisely desired forms can be obtained.

DETAILED DESCRIPTION OF THE PREFERRED EMBODIMENTS

First, a semiconductor substrate to be used in the present invention is not limited but a silicon substrate is suitably used therefor. Here, the semiconductor substrate has a first conductivity type. In the present invention, the first conductivity type means a p-type or an n-type. As for an impurity to give a p-type property to the semiconductor substrate, boron, arsenic or the like can be used. As for an impurity to give an n-type property to the semiconductor substrate, phosphorus or the like can be used.

Next, a gate insulating film is formed on the silicon substrate. Examples of the gate insulating films include a silicon oxide film, a silicon nitride film and a laminated film thereof in the case of using the silicon substrate. A thickness of the gate insulating film is generally from 50 to 150 Å. Further, the gate insulating film may be used also as a tunnel insulating film. A method for forming the gate insulating film used in the present invention is not limited. Any conventional method, e.g., a thermal oxidation method, a CVD method or the like may be used.

Subsequently, a first floating gate material film and an ion implantation protective film are formed in this order on the gate insulating film.

Examples of the first floating gate material films include a polysilicon film and a film made of a metal e.g., aluminum, copper and the like. Here, an impurity providing a specific conductivity may be implanted into the first floating gate material film in advance in the case of using the polysilicon film as the first floating gate material film. A thickness of the first floating gate material film is generally from 500 to 1500 Å. A method for forming the first floating gate material film used in the present invention is not limited. Any conventional method, e.g., an evaporation method, a CVD method or the like may be used.

As the ion implantation protective film, for example, a nitride film may be suitably used. A thickness of the ion implantation protective film is generally from 1500 to 2500 Å. A method for forming the ion implantation protective film used in the present invention is not limited. Any conventional method, e.g., an evaporation method, a CVD method or the like may be used.

Subsequently, a first resist pattern having a given shape is formed on the ion implantation protective film. Here, the given shape is not limited as long as the first floating gate material film and the ion implantation protective film can be formed into stripes spaced apart from each other by a given distance by a later etching process.

Figure 1:
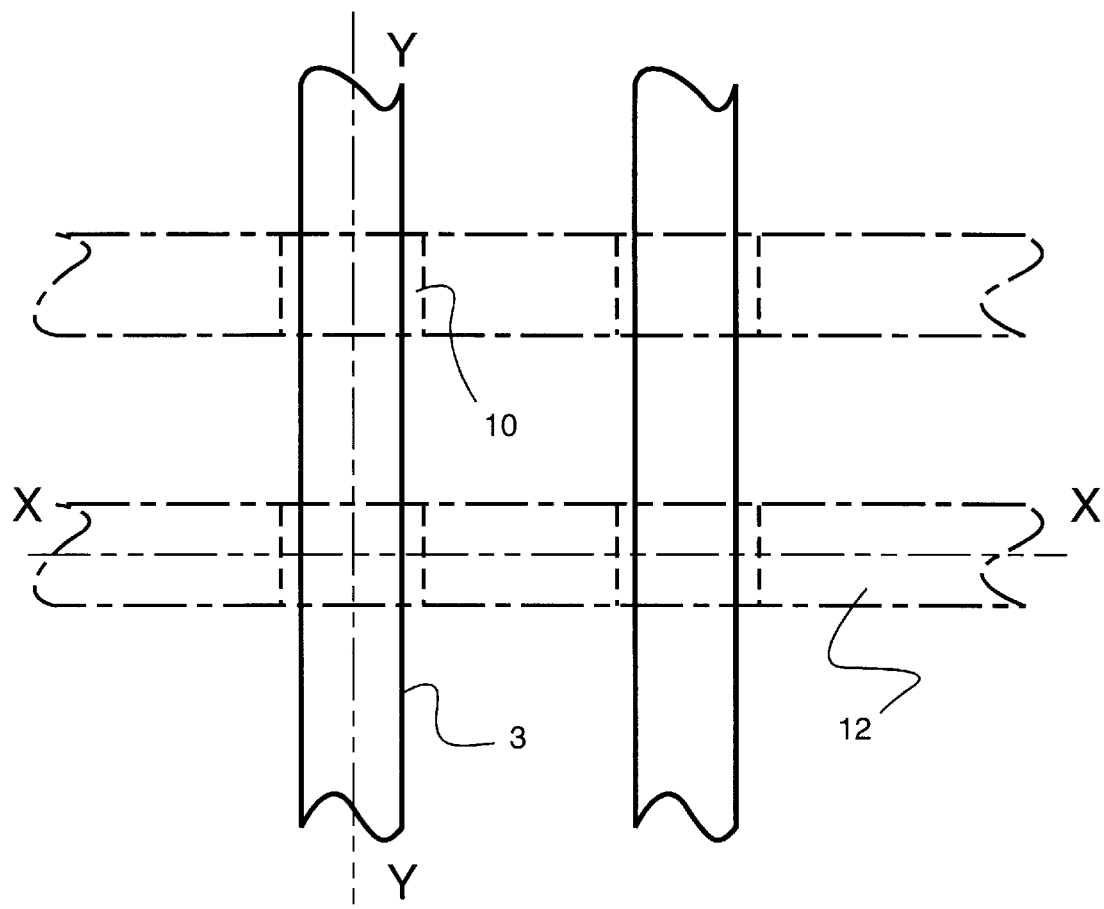
FIG. 1 is a top view of an asymmetrical flash memory of the present invention.

Next, by etching the first floating gate material film and the ion implantation protective film in use of the first resist pattern as a mask, a plurality of stripes comprising the first floating gate material film and the ion implantation protective film are formed which are spaced apart from each other by a given distance. Here, forming a plurality of stripes spaced apart from each other by a given distance means that, for example, a plurality of stripes extending in the direction of Y are formed in the direction of X, as shown in FIG. 1. A plurality means two or more.

The above-mentioned etching may be either an anisotropic etching or an isotropic etching, and may be preferably an anisotropic etching such as RIE so that the portion below of the first resist pattern will not be easily over-etched. Incidentally, a width of the stripe and an interval between two adjacent stripes may vary depending on the type of the semiconductor memory device to be manufactured and may be generally from 0.18 to 0.65 μm and from 0.18 to 0.65 μm, respectively.

Next, after removing the first resist pattern, one longitudinal side wall of the stripes is covered with a second resist pattern.

Then, by an isotropic etching in use of the second resist pattern as a mask, a given width of the other side wall of the first floating gate material film is removed. Here, the given width may vary depending on the type of the semiconductor memory device to be manufactured and may be generally from 0.15 to 0.25 μm. Examples of gases to be used for this anisotropic etching are $CF_4$ and $O_2$.

After removing the second resist pattern, impurity ions having a second conductivity type are implanted into the semiconductor substrate in use of the ion implantation protective film as a mask in a tilted direction. As a result of this implantation, an impurity region of low concentration is formed. A preferred tilted angle for implantation of the impurity ions is about 5 to 50° with respect to a line perpendicular to the semiconductor substrate. The ion implantation is preferably carried out under a condition such that an implantation energy is 20 to 50 keV and a dose of ions is $5\times10^{12}$ to $5\times10^{14}$ cm$^{-2}$. Here, the second conductivity type means an n-type in the case where the first conductivity type is a p-type, and a p-type in the case where the first conductivity type is an n-type.

Next, impurity ions of the second conductivity type are implanted into the semiconductor substrate in use of the ion implantation protective film as a mask in a direction perpendicular to the semiconductor substrate. As a result of this implantation, an impurity region of high concentration is formed. The ion implantation is preferably carried out under a condition such that an implantation energy is 20 to 50 keV and a dose of ions is $3\times10^{14}$ to $3\times10^{16}$ cm$^{-2}$.

As a result of the above-mentioned two ion implantations, asymmetrical impurity regions may be formed on both sides of the stripe like first floating gate material film as viewed in the cross section along the direction perpendicular to the longitudinal direction of the stripes. Incidentally, the asymmetrical impurity regions may be used as source/drain regions of a transistor.

Hereafter, the following treatments are preferably conducted.

First, an oxide film may be formed by selective oxidation of the semiconductor substrate which is not covered with the stripes.

This oxide film preferably has approximately the same height as the first floating gate material film. As a result of forming the oxide film having such a height, flatness of the semiconductor substrate may increase and a difference in height between an insulating film, a control gate and the like to be formed afterwards on the semiconductor substrate may decrease. Consequently, breaking of wire connection, a short-circuit or the like can be avoided. Incidentally, in the case where the impurity region is formed by implanting arsenic ions, the oxide film can be formed in about one nineteenth of the period of time as compared with the case where the impurity ions are not implanted into the region.

After removing the ion implantation protective film, a second floating gate material film, an insulating film and a control gate material film may be formed in this order on the surface of the semiconductor substrate.

Here, as the second floating gate material film, the same kind of film as the first floating gate material film may be used. Also, as a method for forming the second floating gate material film, the method for forming the first floating gate material film may be used. A thickness of the second floating gate material film is generally 500 to 1500 Å. Here, a floating gate may be formed without depositing this second floating gate material film. However, depositing the second floating gate material film may enlarge a surface area of the floating gate to be formed afterwards. Consequently, a coupling ratio with the gate of the floating gate may be increased. Especially, if each material film is deposited so that the first floating gate is covered with the second floating gate, the coupling ratio with the gate may be improved more.

Examples of the insulating films may be an HTO film, a silicon oxide film, a silicon nitride film and a laminated film thereof. An ONO film (a HTO film, a silicon nitride film and a HTO film) may be used as the insulating film. A thickness of the insulating film is generally 120 to 200 Å. A method for forming the insulating film used in the present invention is not limited. Any conventional method, e.g., a thermal oxidation method, a CVD method or the like may be used.

As a control gate material film, a silicide film of a metal having high melting point such as titanium, tungsten or the like may be used besides a film similar to the first floating gate material film. A method for forming the control gate material film used in the present invention is not limited. Any conventional method, e.g., a CVD method or the like may be used.

Incidentally, the oxide film between the stripes need not exist at the time of forming the above film. However, it is preferable that the oxide film exists because of the above-mentioned reason.

Next, by etching the gate insulating film, the first floating gate material film, the second floating gate material film and the control gate material film in use of a third resist pattern as a mask, a floating gate composed of the first floating gate and the second floating gate and a control gate are formed.

Then, for example by a known method mentioned below, an interlayer insulating film, a contact hole and a metal wiring may be formed.

First, an interlayer insulating film of an NSG film, a BPSG film and a laminated film thereof is deposited and a melt processing is conducted for flattering. Then, a contact hole is formed on a given region by a photolithography process. Next, a metal film such as Al—Si—Cu is deposited on the surface of the interlayer insulating film including the contact hole. After that, by the photolithography process, a metal wiring may be formed by processing the metal film into a given shape.

The above-mentioned manufacturing method of the present invention may be applied to any semiconductor memory device as long as the semiconductor memory device includes a gate and an impurity region functioning as a source/drain. Examples of semiconductor memory devices are a flash memory and the like.

EXAMPLE 1

The present invention is now detailed by way of Example 1 shown below.

FIGS. 2(a) to 4(b) are cross sections along the line X—X for explaining a method for manufacturing a semiconductor memory device of Example 1 of FIG. 1. FIGS. 5(a) to 7(b) are cross sections along the line Y—Y for explaining the method for manufacturing the semiconductor memory device of Example 1 of FIG. 1.

Hereafter, the manufacturing steps for the semiconductor device of Example 1 are described with reference to FIGS. 1 to 7(b).

First, a gate oxide film 2 was formed to a thickness of 100 Å on a surface of a p-type silicon substrate 1, and then a polysilicon layer 3 for a floating gate was formed to a thickness of 1000 Å. Next, an implantation of phosphorus ions ($^{31}P^+$) was carried out into the polysilicon layer 3 with an implantation energy of 40 keV in a dose of $5.0 \times 10^{14}$ $cm^{-2}$. Subsequently, a nitride film 4 was formed to a thickness of 2000 Å on the polysilicon layer 3 (FIGS. 2(a) and 5(a)). This nitride film 4 was used as an ion implantation protective film for arsenic ion implantation to be performed later.

Then, a stripe like resist pattern 5 was formed on the nitride film 4 to cover an active region of the silicon substrate 1. In use of the resist pattern 5 as a mask, the nitride film 4 and the polysilicon layer 3 were successively etched (FIGS. 2(b) and 5(b)). Incidentally, in this etching, the gate oxide film 2 was also etched a little because of over-etching.

Figure 2A:
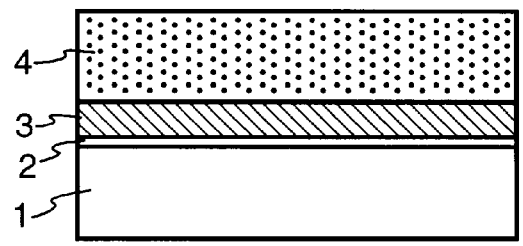
FIGS. 2(a) to 2(d) are cross sections along the line X—X for explaining a method for manufacturing a semiconductor memory device of the present invention of FIG. 1.
Figure 2B:
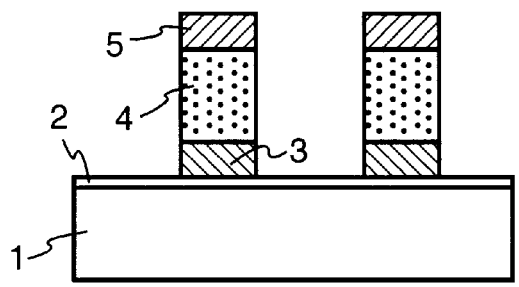
Figure 2C:
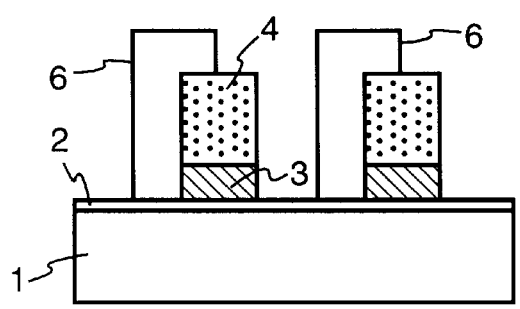
Figure 5A:
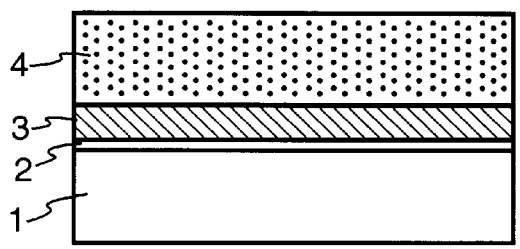
FIGS. 5(a) to 5(d) are cross sections along the line Y—Y for explaining the method for manufacturing the semiconductor memory device of the present invention of FIG. 1.
Figure 5B:
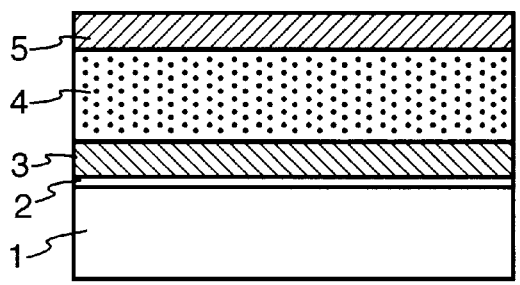
Figure 5C:
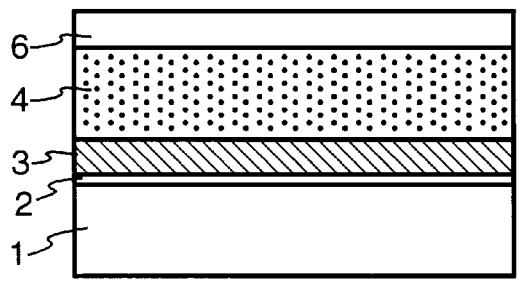

Next, in order to form an asymmetric cell, a resist pattern 6 was formed to cover one longitudinal side wall of stripes formed in the previous etching step and composed of the nitride film/polysilicon layer/gate oxide film (FIGS. 2(c) and 5(c)).

Figure 2D:
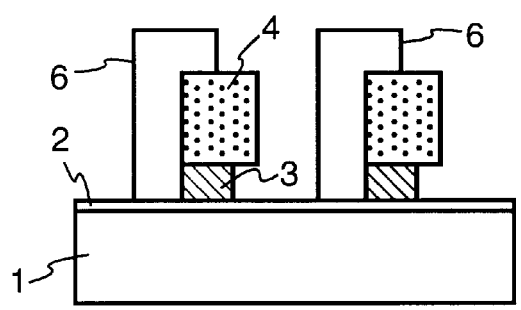
Figure 5D:
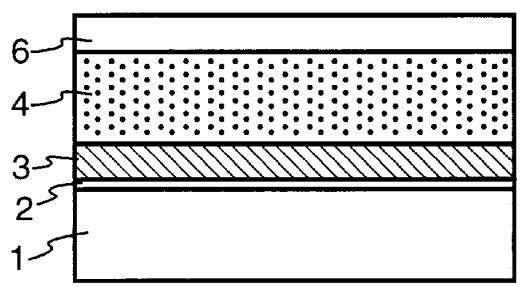

Next, by an isotropic etching, only one side of the polysilicon layer 3 was etched (FIGS. 2(d) and 5(d)). At this time, the polysilicon layer 3 was etched by 0.2 μm under an etching condition such that the selectivity of a reactive gas to the polysilicon layer 3 was higher than the selectivity to the nitride film 4 and the gate oxide film 2. This etching was conducted using a plasma etcher as an apparatus under a condition such that a gas flow rate ratio of $CF_4/O_2$ was 150/60(sccm), a pressure was 40 Pa and a microwave power was 500 W. L/W of the final gate electrode was 0.65/0.35 μm.

Figure 3A:
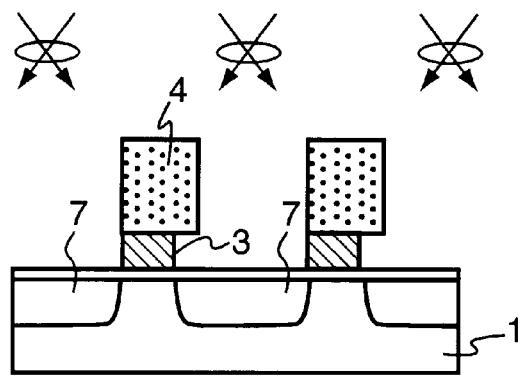
FIGS. 3(a) to 3(c) are cross sections along the line X—X for explaining the method for manufacturing the semiconductor memory device of the present invention of FIG. 1.
Figure 6A:
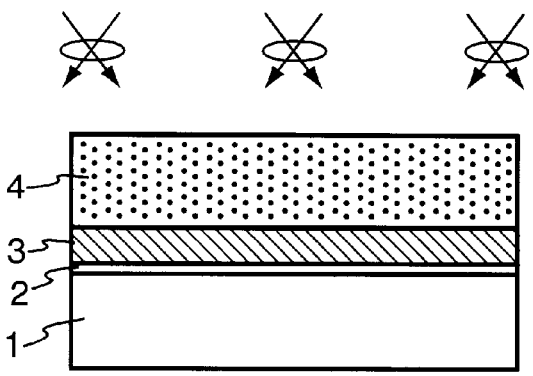
FIGS. 6(a) to 6(c) are cross sections along the line Y—Y for explaining the method for manufacturing the semiconductor memory device of the present invention of FIG. 1.

Subsequently, the resist pattern 6 was removed and an implantation of arsenic ions ($^{75}As^+$) was carried out in a tilted direction into the entire surface of the substrate 1 with an implantation energy of 40 keV in a dose of $5.0 \times 10^{13}$ $cm^{-2}$ to form an n-type impurity region 7 of low concentration in the silicon substrate 1 (FIGS. 3(a) and 6(a)). In the case where a spacing between the floating gates was 0.45 μm, a tilted angle for implantation of the impurity ions was 28° with respect to the line perpendicular to the semiconductor substrate.

Figure 3B:
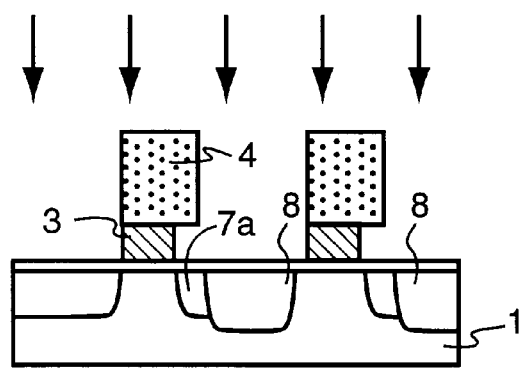
Figure 3C:
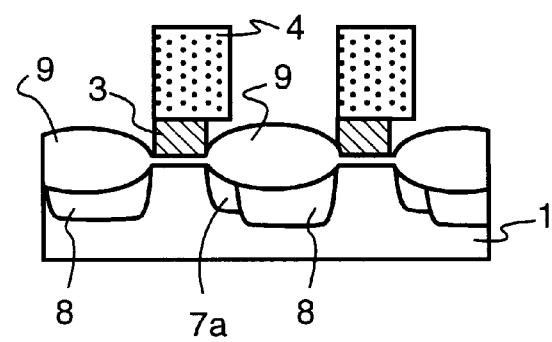
Figure 6B:
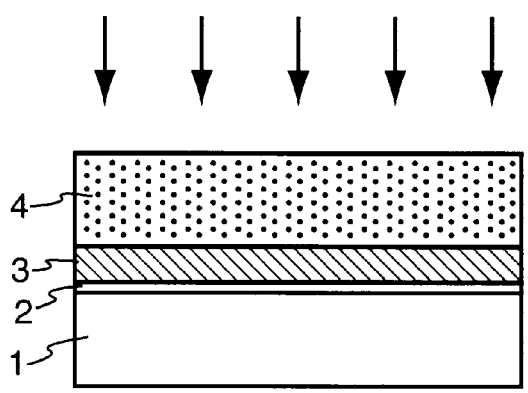
Figure 6C:
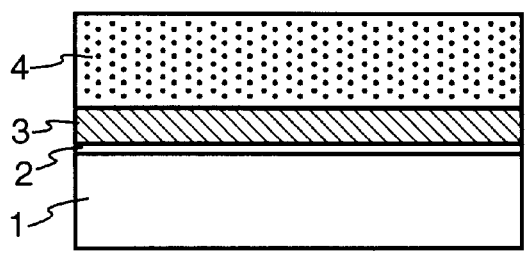

Next, an implantation of arsenic ions was carried out, with an implantation angle of 0° with respect to the line perpendicular to the semiconductor substrate, into the entire surface of the substrate 1 with an implantation energy of 40 keV in a dose of $3.0 \times 10^{15}$ $cm^{-2}$ to form an n-type impurity region 8 of high concentration in the silicon substrate 1 (FIGS. 3(b) and 6(b)). At this time, the nitride film lay over the etched portion of the polysilicon layer 3. Therefore, arsenic ions of n-type impurity of high concentration were not implanted into the previously formed n-type impurity region 7a of low concentration lying right under the nitride film. Accordingly, a cell having an asymmetrical structure was formed.

Then, a selective oxidation was performed on a portion of the silicon substrate 1 which was not covered with the stripes at a temperature of 800° C. for 13 minutes. By this selective oxidation, an oxide film 9 was formed to a thickness of 1000 Å in a space up to the height of the polysilicon layer 3, with a result that the surfaces of both the polysilicon layer 3 and the oxide film 9 were substantially coplanar. The ion implantation of arsenic ions conducted before this selective oxidation process promoted oxidation. That is, an annealing treatment for forming the oxide film to a thickness of 1000 Å can be completed in 13 minutes at 800° C. in the case where arsenic ions have been implanted before, whereas it requires 250 minutes at 800° C. in the case where arsenic ions have not been implanted before. Moreover, in forming the oxide film 9, it is unnecessary to use an oxidation-preventive film.

Next, the nitride film 4 was removed by a treatment with hot phosphoric acid. Then, a polysilicon layer 10 for a floating gate was deposited to a thickness of 1000 Å. Next, an implantation of phosphorus ions was carried out into the polysilicon layer 10 with an implantation energy of 60 keV in a dose of $6.0 \times 10^{14}$ $cm^{-2}$. Here, the reason why the polysilicon layers (3 and 10) for the floating gates are deposited separately is for enlarging the surface area of the floating gate to raise the coupling ratio with the gate.

Figure 4A:
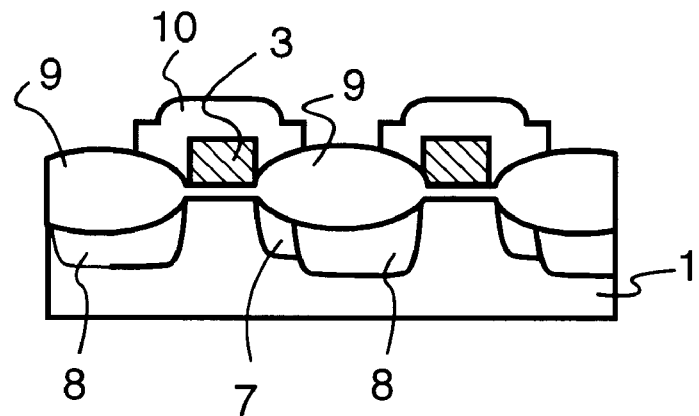
FIGS. 4(a) and 4(b) are cross sections along the line X—X for explaining the method for manufacturing the semiconductor memory device of the present invention of FIG. 1.
Figure 4B:
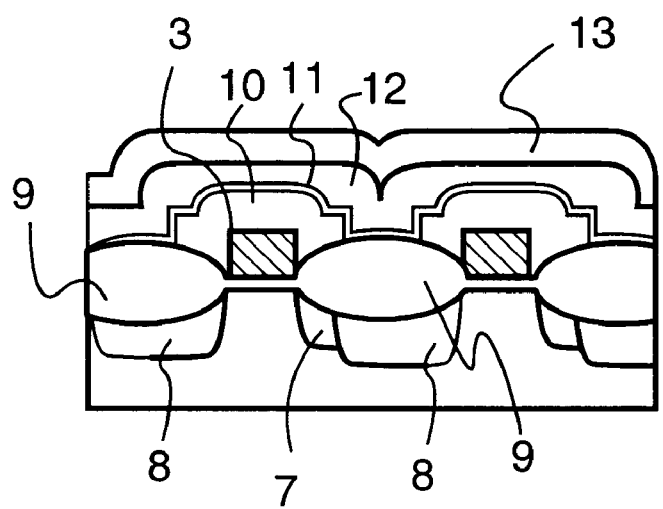
Figure 7A:
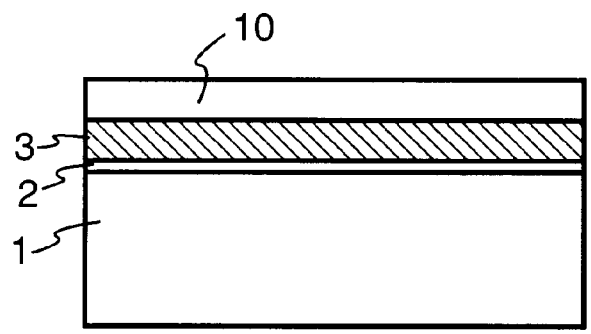
FIGS. 7(a) and 7(b) are cross sections along the line Y—Y for explaining the method for manufacturing the semiconductor memory device of the present invention of FIG. 1.
Figure 7B:
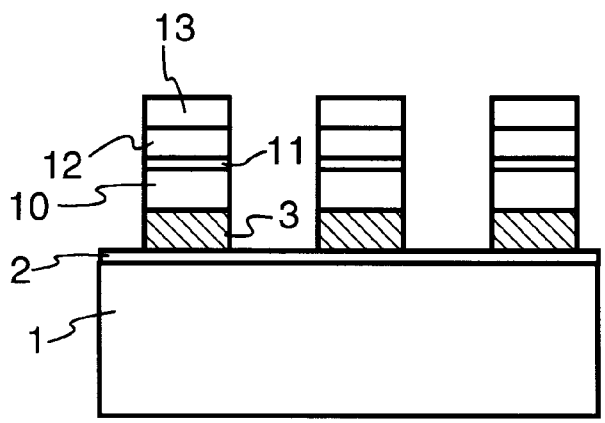
Figure 8A:
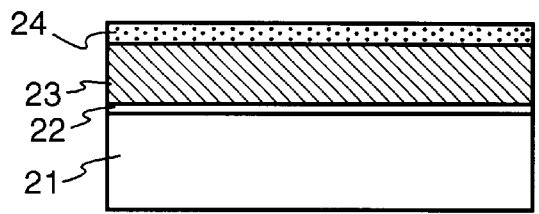
FIGS. 8(a) to 8(d) are cross sections along the line X—X for explaining a method for manufacturing a conventional asymmetrical semiconductor memory device of FIG. 14.
Figure 8B:
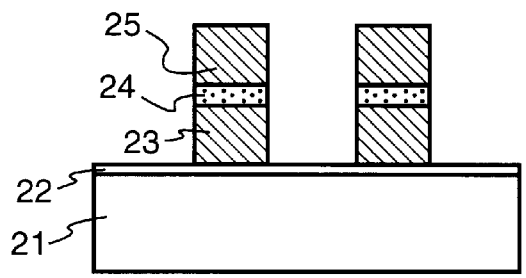
Figure 8C:
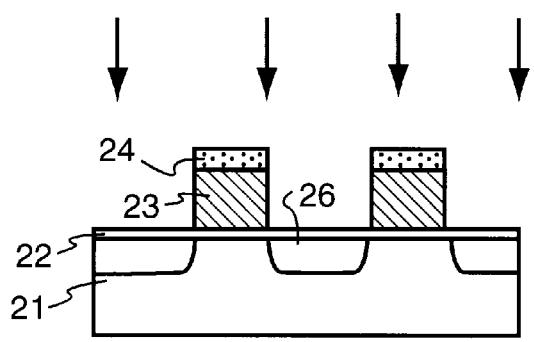
Figure 8D:
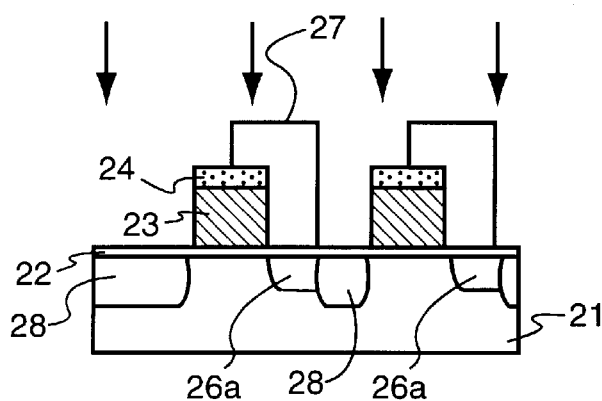
Figure 9A:
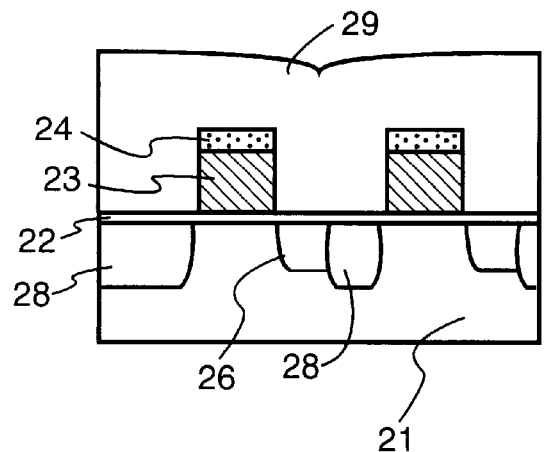
FIGS. 9(a) to 9(c) are cross sections along the line X—X for explaining the method for manufacturing the conventional asymmetrical semiconductor memory device of FIG. 14.
Figure 9B:
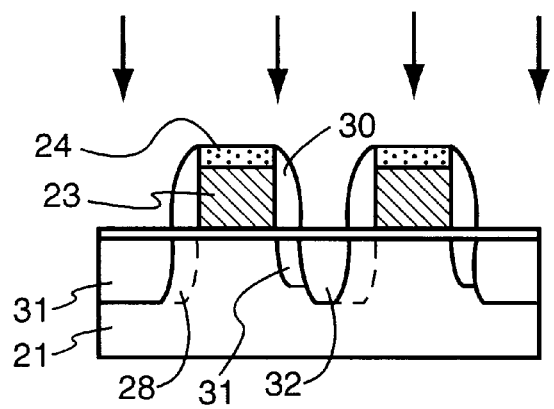
Figure 9C:
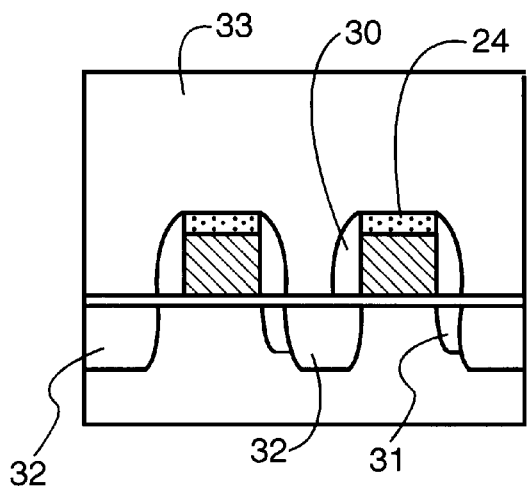
Figure 10A:
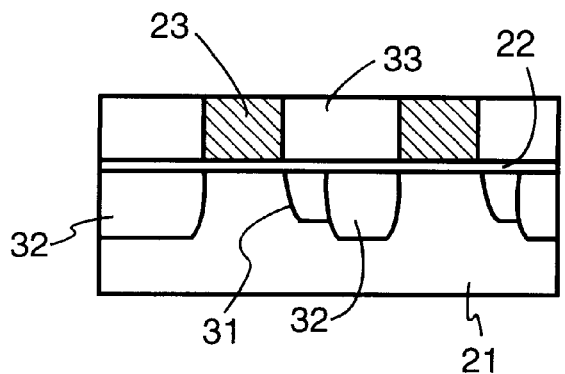
FIGS. 10(a) to 10(c) are cross sections along the line X—X for explaining the method for manufacturing the conventional asymmetrical semiconductor memory device of FIG. 14.
Figure 10B:
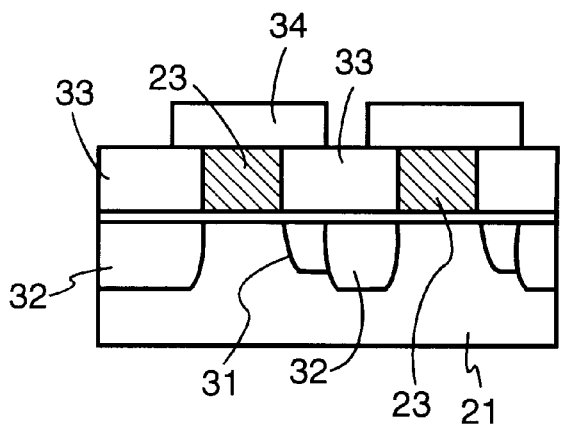
Figure 10C:
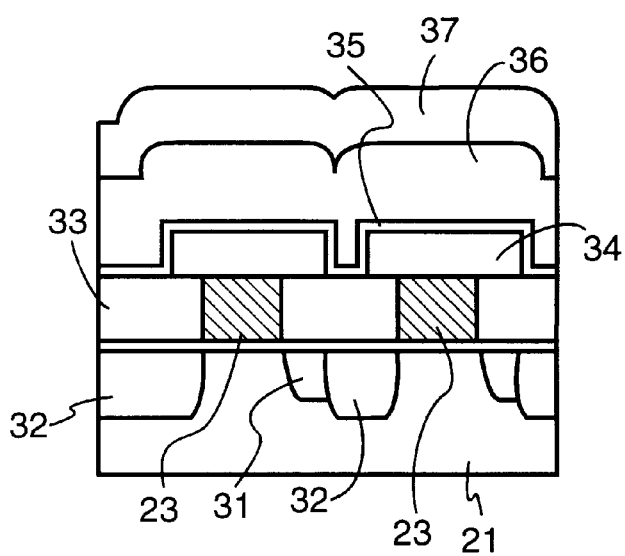
Figure 11A:
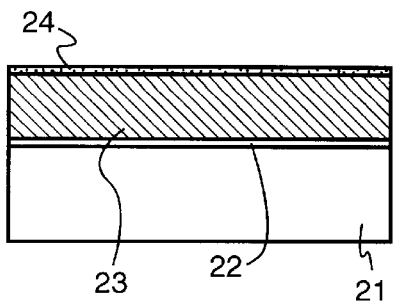
FIGS. 11(a) to 11(d) are cross sections along the line Y—Y for explaining the method for manufacturing the conventional asymmetrical semiconductor memory device of FIG. 14.
Figure 11B:
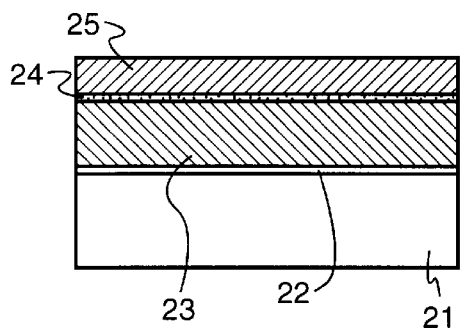
Figure 11C:
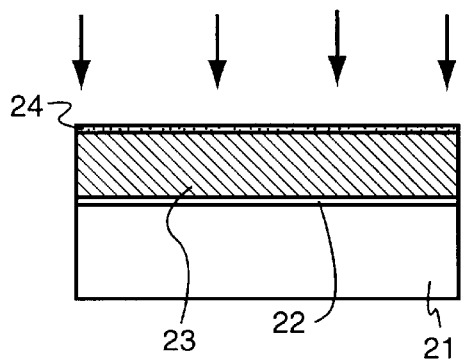
Figure 11D:
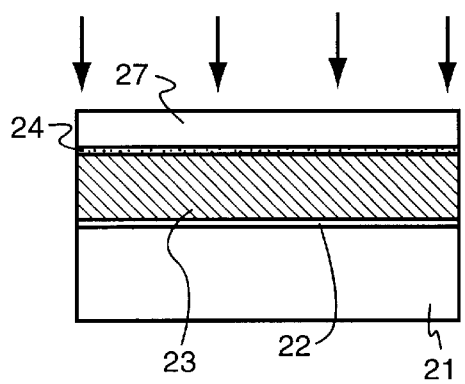
Figure 12A:
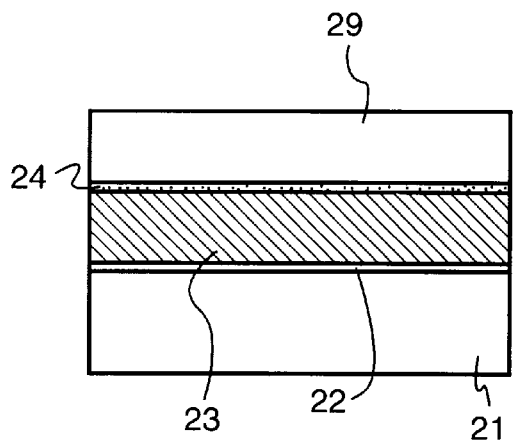
FIGS. 12 (a) to 12(c) are cross sections along the line Y—Y for explaining the method for manufacturing the conventional asymmetrical semiconductor memory device of FIG. 14.
Figure 12B:
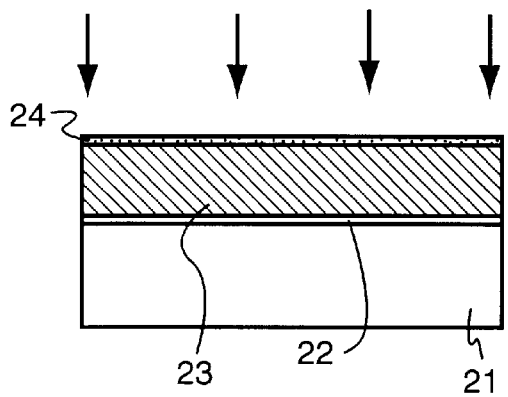
Figure 12C:
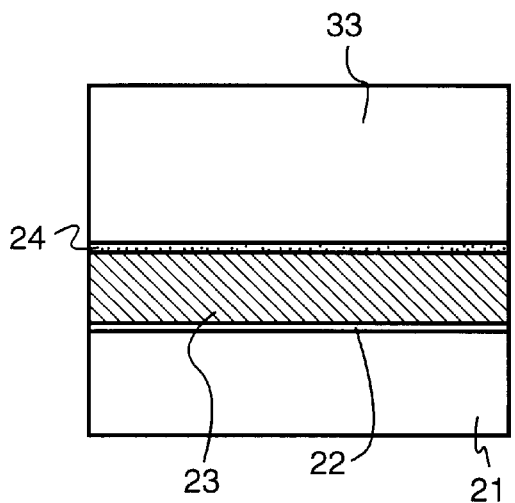
Figure 13A:
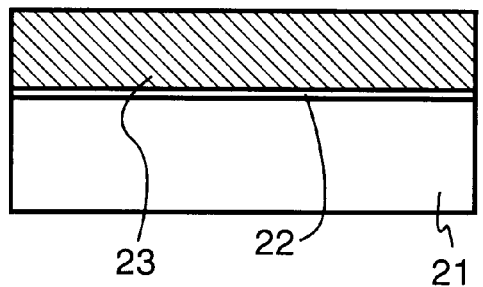
FIGS. 13(a) to 13(c) are cross sections along the line Y—Y for explaining the method for manufacturing the conventional asymmetrical semiconductor memory device of FIG. 14.
Figure 13B:
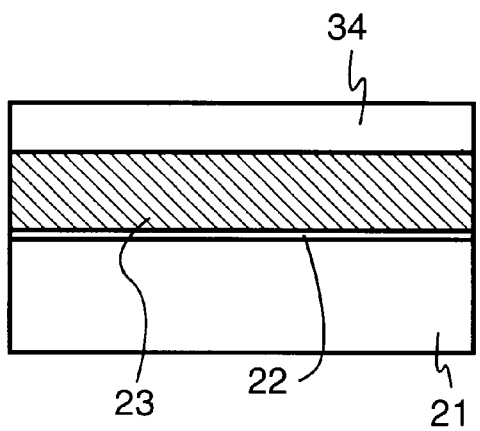
Figure 13C:
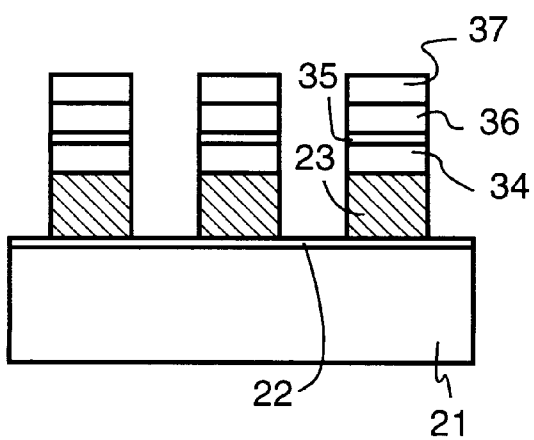
Figure 14:
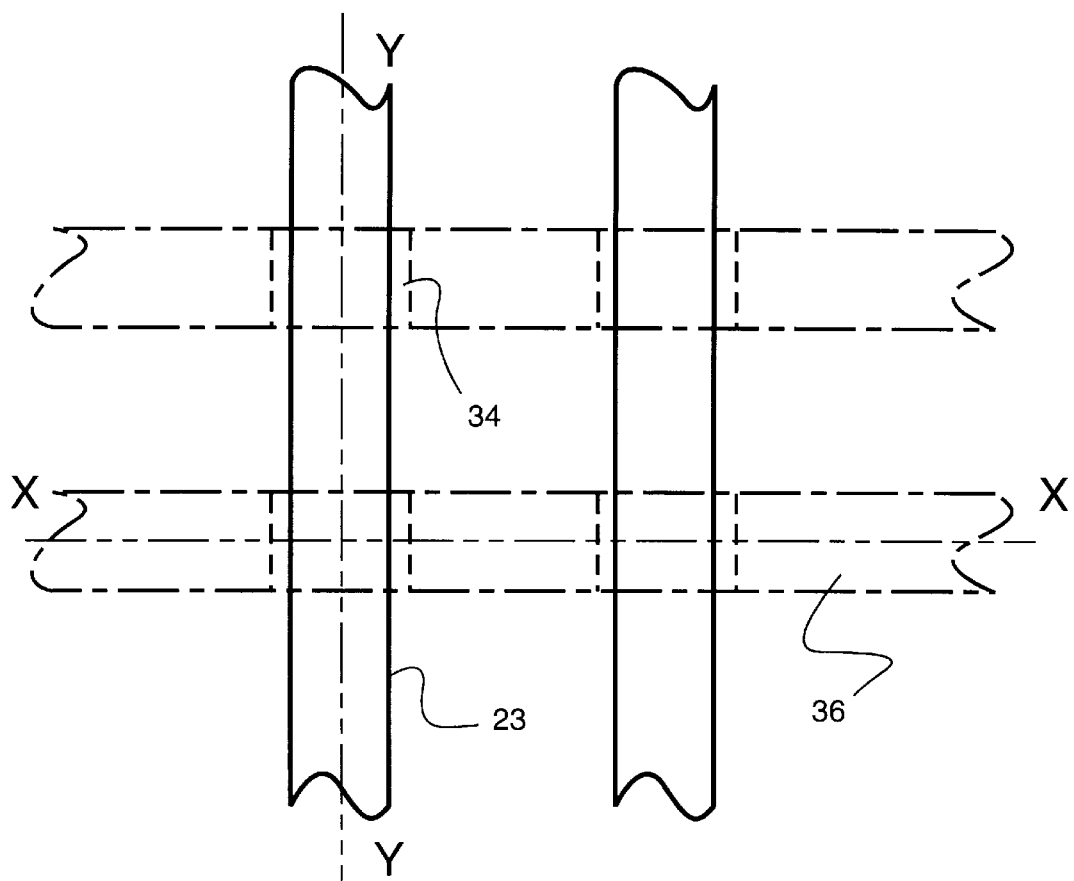
FIG. 14 is a top view of a conventional asymmetrical flash memory.

Then, patterning was conducted with a resist pattern (not shown) used as a mask (FIGS. 4(a) and 7(a)). After removing the resist pattern, an ONO film 11 (HTO film 150 Å/SiN film 250 Å/HTO film 150 Å) was formed and a polysilicon layer 12 for a control gate was deposited to a thickness of 1000 Å. Next, an implantation of phosphorus ions was carried out into the polysilicon layer 12 with an implantation energy of 60 keV in a dose of $5.0 \times 10^{12}$ $cm^{-2}$. Further, a tungsten silicide (WSi) layer 13 was deposited to a thickness of 1000 Å. Then, with a resist pattern (not shown) used as a mask, the tungsten silicide layer 13, the polysilicon layer 12, the ONO film 11, the polysilicon layers 10 and 3 and the gate oxide film 2 were successively etched (FIGS. 4(b) and 7(b)). By this etching, the polysilicon layer 3, the polysilicon layer 10 and the tungsten silicide layer 13 turned into the first floating gate, the second floating gate and the control gate, respectively.

Then, an NSG film of a thickness of 1000 Å and a BPSG film of a thickness of 5000 Å were deposited by a CVD method as an interlayer insulating film, followed by performing a melt processing at 900° C. for 10 minutes, forming a contact hole by a photolitho-etching process, depositing an Al—Si—Cu film to a thickness of 5000 Å by a sputtering method, and forming a metal wiring by the photolitho-etching process to complete a flash memory.

As described above in detail, according to the manufacturing method of the present invention, it is possible to etch only one side of the polysilicon layer for the floating gate within a precision range of ±0.05 μm in width as viewed in the cross section along the channel length by the isotropic etching method. Therefore, it is possible to overcome the problems in conventional methods, such as a drop in the breakdown voltage caused by a punch-through when the impurity region of low concentration becomes too narrow and a decrease in read-out current when the impurity region of low concentration becomes too wide. Accordingly, the electrical characteristics of the non-volatile semiconductor memory device having a control gate and a floating gate such as the flash memory can be stabilized.

Further, memory cells having asymmetrical impurity regions may be formed in a self-aligned manner as viewed in the cross section along the channel length because the implantation of arsenic ions is carried out in use of the ion implantation protective film as a mask. Therefore, the number of processes for forming the asymmetrical cell can be decreased.

Also, forming the oxide film on the asymmetrical impurity regions by selective oxidation can lead to improvement in flatness of the surface of the semiconductor memory device.

Further, the two-layer structure of the floating gate can increase the surface area of the floating gate. Accordingly, it can increase the coupling ratio with the gate.

What is claimed is:

1. A method for manufacturing a semiconductor memory device, comprising the steps of:

forming a gate insulating film, a first floating gate material film and an ion implantation protective film in this order over the surface of a semiconductor substrate of a first conductivity type;

forming a first resist pattern on the ion implantation protective film;

forming a plurality of stripes comprising the first floating gate material film and the ion implantation protective film, the stripes being spaced apart from each other by a given distance, by etching in use of the first resist pattern as a mask;

forming a second resist pattern to cover one longitudinal side wall of the stripes after removing the first resist pattern;

removing a given width of the other side wall of the first floating gate material film by an isotropic etching with the second resist pattern used as a mask;

forming an impurity region of a low concentration by implanting impurity ions of a second conductivity type into the semiconductor substrate of the first conductivity type with the ion implantation protective film used as a mask in a tilted direction after removing the second resist pattern; and forming asymmetrical impurity regions on both sides of the stripe like first floating gate material film as viewed in the cross section along the direction perpendicular to the longitudinal direction of the stripes by implanting impurity ions of the second conductivity type into the semiconductor substrate of the first conductivity type with the ion implantation protective film used as a mask in the direction perpendicular to the semiconductor substrate to form an impurity region of high concentration.

2. The method of claim 1, wherein the impurity ions of the second conductivity type are arsenic ions.

3. The method of claim 1, wherein the stripes are formed by anisotropic etching.

4. The method of claim 1, wherein the stripes are formed so that they are spaced apart from each other by a distance of 0.18 to 0.65 $\mu$m.

5. The method of claim 1, wherein the other side of the first floating gate material film is removed by 0.15 to 0.25 $\mu$m in width.

6. The method of claim 1, wherein the impurity ions of the second conductivity type implanted in the tilted direction are implanted into the silicon substrate in a tilted angle of 5 to 50° with respect to the line perpendicular to the semiconductor substrate.

7. The method of claim 1, wherein an oxide film is formed by selective oxidation of the semiconductor substrate which is not covered with the stripes, after forming the asymmetrical impurity regions.

8. The method of claim 7, wherein the oxide film has approximately the same height as the first floating gate material film.

9. The method of claim 1, further comprising steps of:

after forming the impurity regions and removing the ion implantation protective film, forming a second floating gate material film, an insulating film and a control gate material film in this order over the entire surface of the semiconductor substrate; and forming a first floating gate, a second floating gate and a control gate by etching with a third resist pattern of a given shape used as a mask.

10. The method of claim 9, wherein the first floating gate is covered with the second floating gate.

* * * * *